(12) United States Patent
Boulharts et al.

(10) Patent No.: US 11,480,629 B2
(45) Date of Patent: Oct. 25, 2022

(54) ELECTRONIC DEVICE AND METHOD FOR DETERMINING AT LEAST ONE CHARACTERISTIC PARAMETER OF A CONNECTION SET CONNECTED BETWEEN A CONVERTER AND AN ELECTRIC MACHINE, RELATED POWER SUPPLY CHAIN AND COMPUTER PROGRAM

(71) Applicant: Schneider Toshiba Inverter Europe SAS, Pacy sur Eure (FR)

(72) Inventors: Hocine Boulharts, Triel sur Seine (FR); Rudolf Fehringer, Vienna (AT); Mehdi Messaoudi, Shanghai (CN)

(73) Assignee: Schneider Toshiba Inverter Europe SAS, Pacy sur Eure (FR)

( * ) Notice: Subject to any disclaimer, the term of this patent is extended or adjusted under 35 U.S.C. 154(b) by 58 days.

(21) Appl. No.: 17/093,884

(22) Filed: Nov. 10, 2020

(65) Prior Publication Data
US 2021/0141032 A1 May 13, 2021

(30) Foreign Application Priority Data

Nov. 12, 2019 (EP) .................................... 19306465

(51) Int. Cl.
*G01R 31/68* (2020.01)
*G01R 27/00* (2006.01)
(Continued)

(52) U.S. Cl.
CPC ............. *G01R 31/68* (2020.01); *G01R 27/00* (2013.01); *H02M 7/523* (2013.01); *H02P 27/08* (2013.01)

(58) Field of Classification Search
CPC ........ G01R 31/68; G01R 27/00; G01R 27/02; G01R 19/00; G01R 27/08; G01R 27/2605;
(Continued)

(56) References Cited

U.S. PATENT DOCUMENTS

2013/0057297 A1* 3/2013 Cheng .................... H02M 7/539
324/548
2015/0355259 A1* 12/2015 Sartler .................. H02M 1/126
324/548

FOREIGN PATENT DOCUMENTS

| CN | 103595334 A | 2/2014 |
| CN | 104882887 A | 9/2015 |

(Continued)

OTHER PUBLICATIONS

Extended European Search Report dated May 15, 2020 for European Application No. 19306465.6-1201, 59 pages.

*Primary Examiner* — Akm Zakaria
(74) *Attorney, Agent, or Firm* — Locke Lord LLP

(57) ABSTRACT

An electronic determination device for determining at least one characteristic parameter of a connection set connected between a converter and an electric machine; the converter comprising at least two output terminals and, for each output terminal, a switching branch including at least one converter switch; the connection set comprising a filter connected to the output terminals and a cable connected between the filter and the electric machine; the filter including, for each output terminal, a respective electromagnetic coil connected to said output terminal and a respective capacitor connected to said coil; the determination device comprising:

for each output terminal, a device switch configured to be connected to the respective capacitor;
a generation module configured to generate a voltage pulse through the connection set, by controlling the converter switches and each device switch;

(Continued)

an acquisition module configured to acquire measurements of respective current(s) and voltage(s) through the filter, further to the generation of the respective voltage pulse; and a calculation module configured to calculate at least one characteristic parameter of the connection set according to the respective current(s) and voltage(s) measurements.

14 Claims, 6 Drawing Sheets

(51) Int. Cl.
    *H02M 7/523*     (2006.01)
    *H02P 27/08*     (2006.01)

(58) Field of Classification Search
    CPC ... G01R 27/2611; H02M 7/523; H02M 1/126;
                 H02M 7/48; H02M 1/12; H02P 27/08;
                                      H02P 27/06
    See application file for complete search history.

(56) References Cited

FOREIGN PATENT DOCUMENTS

| | | | | |
|---|---|---|---|---|
| CN | 205846735 U | 12/2016 | | |
| EP | 1643626 A2 * | 4/2006 | ............. | H02M 1/12 |
| EP | 1643626 A2 | 4/2006 | | |
| JP | 2008209172 A | 9/2008 | | |

\* cited by examiner

ELECTRONIC DEVICE AND METHOD FOR DETERMINING AT LEAST ONE CHARACTERISTIC PARAMETER OF A CONNECTION SET CONNECTED BETWEEN A CONVERTER AND AN ELECTRIC MACHINE, RELATED POWER SUPPLY CHAIN AND COMPUTER PROGRAM

FIELD OF THE INVENTION

The present invention relates to an electronic determination device for determining at least one characteristic parameter of a connection set connected between a converter and an electric machine.

The invention also relates to a power supply chain for an electric machine, the power supply chain comprising a converter, a connection set connected to the output of the converter and adapted to be connected to the electric machine, and such an electronic determination device for determining at least one characteristic parameter of the connection set.

The invention also relates to a determination method for determining at least one characteristic parameter of a connection set connected between a converter and an electric machine, the method being implemented by such an electronic determination device.

The invention also relates to a computer program including software instructions which, when executed by a processor, implement such a determination method.

BACKGROUND OF THE INVENTION

This invention concerns the characterization of a connection set connected between a converter and an electric machine.

The use of electric machines is omnipresent in the industrial world. Electric machines are motors that consume electrical energy or generators that produce electrical energy, for example by the force of the wind for a wind turbine or by the force of a tide for a hydro turbine. Electric machines are generally connected to a power converter with a cable. The power converter generates fast transition at the end of the cable which is connected to said converter. At the other end of the cable which is connected to the electric machine, an overvoltage appears to terminals of the machine and leakage currents circulate in the earth. Such disturbances require the use of a LC filter. Therefore, a connection set connected between the converter and the electric machine generally includes the cable and such a filter.

To optimize performances of such a system comprising the electric machine and the power converter connected together via the connection set, the knowledge of characteristic parameter(s) of said connection set are necessary.

The characteristic parameter(s) of the connection set can be determined beforehand, i.e. before running the system, for example by adequate measurements just after the manufacturing of the cable and respectively of the filter, or else according to data sheet of the cable and respectively of the filter.

However, beforehand determination of the characteristic parameter(s) of the connection set does not guarantee that the value of the characteristic parameter(s) remains identical throughout the use of the connection set. Typically, the capacitance of capacitors of the filter decreases under the influence of the ageing, for example up to 30% of the initial value. In addition, the length of the cable which is defined beforehand may also change further to a modification of the system. In the case of an existing system, the length and the characteristics of the cable are known with difficulty. Finally, a cable can undergo mechanical and thermal constraints modifying its geometry and its dielectric properties of the cable. Therefore, the characteristic parameter(s) of the cable may also be modified throughout the use of the connection set.

All these potential events require to implement a device for determining the characteristic parameter(s) of the connection set throughout its use.

Accordingly, it is known to use an impedance analyzer, to determine the impedance of the filter, namely an inductance of a respective electromagnetic coil and a capacitance of a respective capacitor of the filter.

It is also known to use a Time Domain Reflectometry (TDR) device to determine a propagation time of the cable, as disclosed in the application note from the company TEKTRONIX entitled "TDR Impedance Measurements: A Foundation for Signal Integrity".

However, the use of such an impedance analyzer and/or such a TDR device may be quite burdensome.

SUMMARY OF THE INVENTION

An object of the invention is therefore to provide an electronic determination device and related method for determining at least one characteristic parameter of a connection set connected between a converter and an electric machine, which allow an easier and more convenient determination of said characteristic parameter(s).

For this purpose, the subject-matter of the invention is an electronic determination device according to claim 1.

The determination device according to the invention therefore allows using the converter switches of the converter in order to generate a voltage pulse through the connection set, while controlling the device switches connected to the capacitors of the filter in an appropriate manner, and then to measure respective current(s) and voltage(s) through the filter, each characteristic parameter of the connection set being further calculated in a convenient manner according to the respective measured current(s) and voltage(s).

The control of the device switches connected to the capacitors of the filter typically depends on the characteristic parameter to be determined and also on the respective output terminal of the converter for which the characteristic parameter is determined.

According to other advantageous aspects of the invention, the electronic determination device comprises one or several of the following features, taken individually or according to any technically possible combination, according to any one of claims 2 to 12.

According to another advantageous aspect of the invention, the converter is a DC/AC converter configured for converting a DC current into an AC current and the electric machine is an AC electric machine.

The subject-matter of the invention is also a power supply chain for an electric machine, according to claim 13.

The subject-matter of the invention is also a method for determining at least one characteristic parameter of a connection set connected between a converter and an electric machine, according to claim 14.

The subject-matter of the invention is also a computer program according to claim 14.

BRIEF DESCRIPTION OF THE DRAWINGS

The invention will be better understood upon reading of the following description, which is given solely by way of example and with reference to the appended drawings, wherein.

DETAILED DESCRIPTION OF PREFERRED EMBODIMENTS

Figure 1:
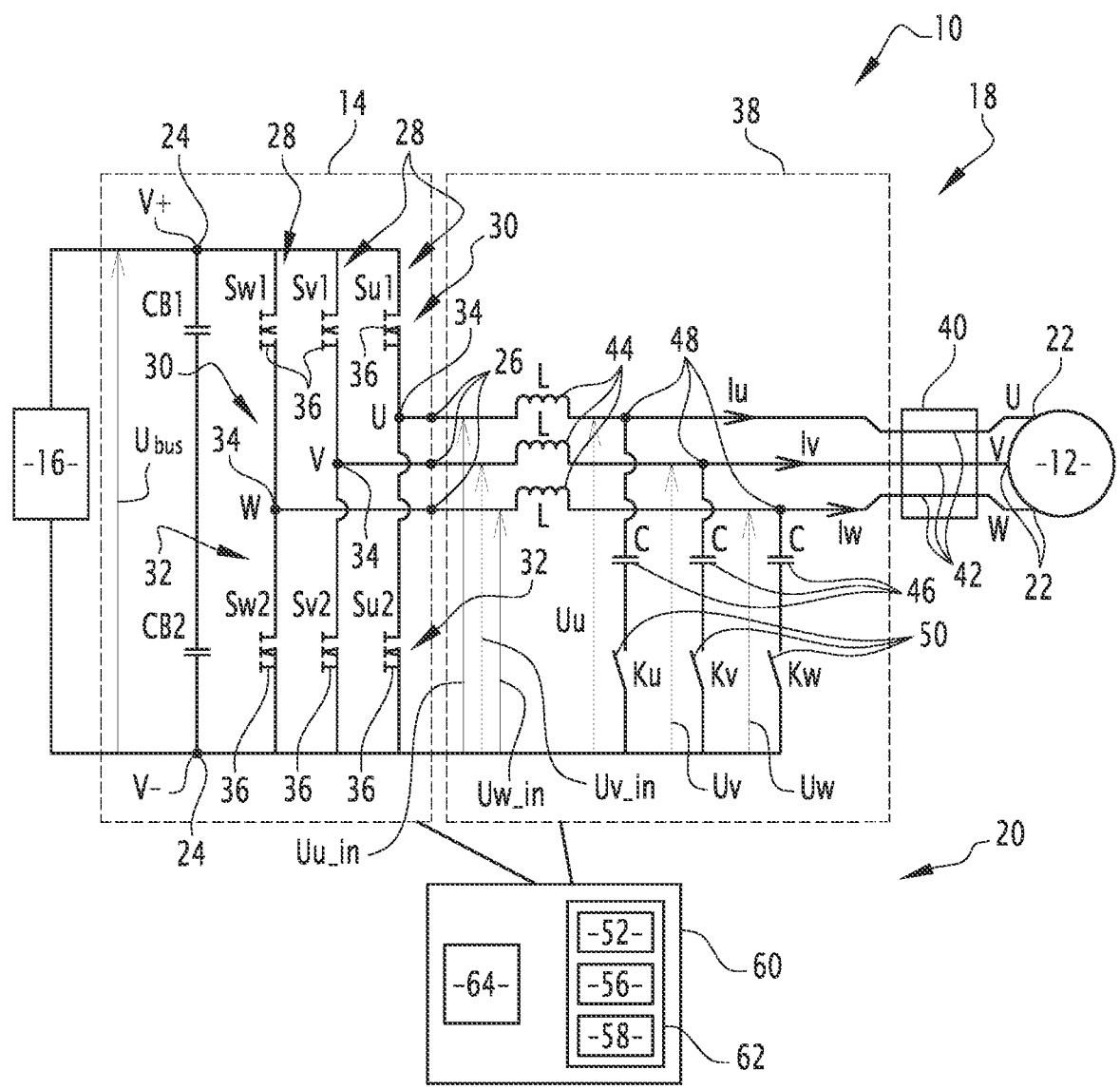
FIG. 1 is a schematic representation of a power supply chain according to the invention for supplying power to an electric machine, the power supply chain comprising a converter, a connection set connected to the output of the converter and adapted to be connected to the electric machine, and an electronic determination device for determining at least one characteristic parameter of the connection set.

In FIG. 1, a power supply chain 10 for an electric machine 12 comprises a converter 14 adapted to be connected to a direct power source 16, a connection set 18 connected to the output of the converter 14 and adapted to be connected to the electric machine 12, and an electronic determination device 20 for determining at least one characteristic parameter $Z_0$, Tp, Cc, L, C, $F_{res}$ of the connection set 18.

The electric machine 12 is preferably an AC electric machine. The electric machine 12 has P phases 22, P being an integer greater than or equal to 3. The electric machine 12 is a motor or a generator. In the example of FIG. 1, the electric machine 12 is a three-phase machine, and P is equal to 3, the three phases 22 being respectively denoted u, v, w.

The converter 14 includes input terminals 24, such as a first input terminal denoted V+ and a second input terminal denoted V− input terminals; and at least two output terminals 26. The converter 14 is preferably a DC/AC converter configured for converting a DC current received at the input terminals 24, into an AC current delivered to the output terminals 26. In the example of FIG. 1, where P is equal to 3, the converter 14 includes three output terminals 26. The converter 14 is for example an N-level converter, N being an integer greater than or equal to 2.

The converter 14 further comprises, for each output terminal 26, a switching branch 28 with first 30 and second 32 switching half-branches connected in series between the two input terminals 24 and connected to each other at an intermediate point 34, the first switching half-branch 30 being connected to the first input terminal V+ and the second switching half-branch 32 being connected to the second input terminal V−, the intermediate point 34 being connected to the respective output terminal 26.

In the following of the description, each intermediate point 34 will get mixed up with the respective output terminal 26 to which it is connected, and will be denoted respectively U, V, W, depending on the corresponding phase u, v, w.

Each switching half-branch 30, 32 includes at least one converter switch 36, the converter switches 36 associated to the output terminal 26 denoted U being denoted $S_Uj$, the ones associated to the output terminal 26 denoted V being denoted $S_Vj$, and the ones associated to the output terminal 26 denoted W being denoted $S_Wj$, where j is a positive integer representing an index of the respective converter switch 36.

Each converter switch 36 is switchable between a closed position in which the current flows through said switch and an open position in which no current flows through said switch. Each converter switch 36 includes at least one controllable interrupter, such as a transistor as shown in FIG. 1, preferably with a freewheel diode, not shown, connected in anti-parallel of the transistor.

In the example of FIG. 1, the converter 14 is a two-level converter, N being equal to 2, and each switching half-branch 30, 32 includes a single converter switch 36, the converter switches 36 of the first switching half-branch 30 being denoted $S_X1$ and the converter switches 36 of the second switching half-branch 32 being denoted $S_X2$, where X is a variable representing the output terminal U, V, W to which the respective converter switch $S_Xj$ is connected.

As a variant, not shown, the number N of levels of the converter 14 is greater than or equal to 3, and each switching half-branch 30, 32 includes several converter switches 36. Each switching half-branch 30, 32 includes typically N−1 converter switches 36.

The connection set 18 includes a filter 38 connected to the output terminals 26 and a cable 40 connected between the filter 38 and the electric machine 12. The cable 40 includes, for each output terminal 26, a respective electrical conductor 42. The filter 38 includes, for each output terminal 38, a respective electromagnetic coil 44 connected to said output terminal 26 and a respective capacitor 46 connected to said coil 44 in a connection point 48, in derivation with respect to said coil 44 and to the respective conductor 42 of the cable 40.

The determination device 20 is configured to determine the at least one characteristic parameter $Z_0$, Tp, Cc, L, C, $F_{res}$ of the connection set 18. Each characteristic parameter $Z_0$, Tp, Cc, L, C, $F_{res}$ is chosen from among the group consisting of: a characteristic impedance $Z_0$ of a respective conductor 42 of the cable 40; a propagation time Tp associated to a respective conductor 42 of the cable 40; a parasitic capacitance Cc of a respective conductor 42 of the cable 40; an inductance L of a respective electromagnetic coil 44 of the filter 38; a capacitance C of a respective capacitor 46 of the filter 38; and a resonance frequency $F_{res}$ of the connection set 18.

The determination device 20 comprises, for each output terminal 26, a device switch 50 configured to be connected to the respective capacitor 46. The device switches 50 are denoted respectively Ku, Kv, Kw depending on the respective output terminal U, V, W to which they are linked through the respective coils 44 and capacitors 46.

The determination device 20 further comprises a generation module 52 for generating a voltage pulse 54 through the connection set 18, by controlling the converter switches 36 and each device switch 50; an acquisition module 56 for acquiring measurements of respective currents and voltages through the filter 38, further to the generation of the respective voltage pulse 52; and a calculation module 58 for calculating at least one characteristic parameter $Z_0$, Tp, Cc, L, C, $F_{res}$ of the connection set 18 according to the respective currents and voltages measurements.

In the example of FIG. 1, the determination device 20 includes a processing unit 60 formed for example of a memory 62 and of a processor 64 coupled to the memory 62.

In the example of FIG. 1, the control module 52, the acquisition module 56 and the calculation module 58 are for example each realized, i.e. implemented, as a software executable by the processor 64. The memory 62 of the processing unit 60 is adapted to store a generation software configured to generate the voltage pulse 54 through the connection set 18, by controlling the converter switches 36 and each device switch 50; an acquisition software configured to acquire measurements of respective currents and voltages through the filter 38, further to the generation of the respective voltage pulse 52; and a calculation software configured to calculate the at least one characteristic parameter $Z_0$, Tp, Cc, L, C, $F_{res}$ of the connection set 18 according to the respective currents and voltages measurements. The processor 64 of the processing unit 60 is then configured to execute the generation software, the acquisition software and the calculation software.

As a variant not shown, the control module 52, the acquisition module 56 and the calculation module 58 are each in the form of a programmable logic component, such as a Field Programmable Gate Array or FPGA, or in the form of a dedicated integrated circuit, such as an Application Specific integrated Circuit or ASIC.

When the determination device 20 is in the form of one or more software programs, i.e. in the form of a computer program, it is also capable of being recorded on a computer-readable medium, not shown. The computer-readable medium is, for example, a medium capable of storing electronic instructions and being coupled to a bus of a computer system. For example, the readable medium is an optical disk, a magneto-optical disk, a ROM memory, a RAM memory, any type of non-volatile memory (for example EPROM, EEPROM, FLASH, NVRAM), a magnetic card or an optical card. A computer program with software instructions is then stored on the readable medium.

Each device switch 50 is switchable between a closed position in which the current flows through said switch and an open position in which no current flows through said switch. Each device switch 50 is controllable by the generation module 52. Each device switch 50 is for example a relay, as shown in FIG. 1.

Each device switch 50 is configured to be connected at one end to a respective capacitor 46 of the filter 38 and at the other end to the other end of the other device switch(es) 50. In the example of FIG. 1, said other ends of the device switches 50 are connected in a star configuration. Alternatively, said other ends of the device switches 50 are connected in a triangle configuration.

In the examples of FIGS. 1 to 13, the current delivered at each output terminal 26 and flowing through each respective electromagnetic coil 44 is denoted respectively Iu, Iv, Iw, depending on the corresponding phase u, v, w. The voltage at each output terminal 26, i.e. at the input of the filter 38, is denoted respectively Uu_in, Uv_in, Uw_in, depending on the corresponding phase u, v, w. Similarly, the voltage between the ends of each capacitor 46 of the filter 38 is denoted respectively Uu, Uv, Uw, depending on the corresponding phase u, v, w.

The generation module 52 is configured to generate the voltage pulse 54 through the connection set 18, by controlling the converter switches 36 and each device switch 50. The generated voltage pulse 54 has an amplitude A, which typically verifies the following equation:

$$A = \frac{Ubus}{N-1} \quad (1)$$

where A represents the amplitude of the voltage pulse 54,

Ubus represents the voltage between the first V+ and second V− input terminals, and N represents the number of levels of the converter 14.

In the example of FIG. 1, where the converter 14 is a two-level converter, the voltage pulse 54 is typically generated between the null voltage and the voltage Ubus. In the variant where N is greater than or equal to 3, the voltage pulse 54 is typically generated between the null voltage and the voltage equal to A, or alternatively between the voltages respectively equals to A and 2A, etc.

The generation of such a voltage pulse with the amplitude A at a respective output terminal 26 of the converter 14 through the control of the converter switches 36 is known per se.

The generation module 52 is for example configured to generate the voltage pulse 54 through a respective output terminal 26, by controlling a respective converter switch 36 of the first switching half-branch 30 for said output terminal 26 to close and a respective converter switch 36 of the second switching half-branch 32 for said output terminal 26 to open, with the respective converter switch 36 of said first switching half-branch 30 being initially open and the respective converter switch 36 of said second switching half-branch 32 being initially closed before said controlling.

In addition, when the voltage pulse 54 has a predefined duration equal to a predefined time period dt, the generation module 52 is further configured to switch off the voltage pulse 54. Accordingly, the generation module 52 is for example configured to switch off the voltage pulse 54 after said predefined time period (dt) further to the generation of the voltage pulse 54, by controlling the aforementioned respective converter switch 36 of the first switching half-branch 30 for said output terminal 26 to open and the aforementioned respective converter switch 36 of the second switching half-branch 32 for said output terminal 26 to close.

The skilled person will understand that when the generation module 52 controls converter switch(es) 36 to close, it means that said converter switch(es) 36 are switched to their closed position; and respectively when the generation module 52 controls converter switch(es) 36 to open, it means that said converter switch(es) 36 are switched to their open position.

The generation module 52 is further configured to control each device switch 50 so that the voltage pulse 54, which is generated through a respective output terminal 26 via the aforementioned control of the converter switches 36, then flows along a particular path of the connection set 18, said path depending on the characteristic parameter $Z_0$, Tp, Cc, L, C, $F_{res}$ to be calculated. This control of the device switches 50 will be described in more details hereinafter in view of FIGS. 2 to 13 and for each characteristic parameter $Z_0$, Tp, Cc, L, C, $F_{res}$.

The acquisition module 56 is configured to acquire measurements of respective current(s) and voltage(s) through the filter 38, further to the generation of the respective voltage pulse 54. The acquisition module 56 is typically configured to acquire respective measurements of a current Iu, Iv, Iw through the electromagnetic coil 44 connected to a respective output terminal 26 and of a voltage Uu, Uv, Uw in the respective connection point 48 for a respective output terminal 26, said currents Iu, Iv, Iw and voltages Uu, Uv, Uw being shown at least in FIG. 1 and depending on the corresponding phase u, v, w. Similarly, the acquisition of these measurements will be described in more details hereinafter in view of FIGS. 2 to 13 and for each characteristic parameter $Z_0$, Tp, Cc, L, C, $F_{res}$.

The calculation module 58 is then configured to calculate the at least one characteristic parameter $Z_0$, Tp, Cc, L, C, $F_{res}$ of the connection set 18 according to said respective current(s) and voltage(s) measurements.

Calculation of the Characteristic Impedance $Z_0$, the Inductance L, the Propagation Time Tp and/or the Parasitic Capacitance Cc When at least one characteristic parameter to be determined is among the aforementioned characteristic impedance $Z_0$, inductance L, propagation time Tp and parasitic capacitance Cc, the generation module 52 is further configured, before the generation of the voltage pulse 54 through a respective output terminal 26, to control the device switches 50 to open, and the converter switch(es) 36 of the second switching half-branch 32 for one output terminal 26 other than said respective output terminal 26 to close.

Figure 2:
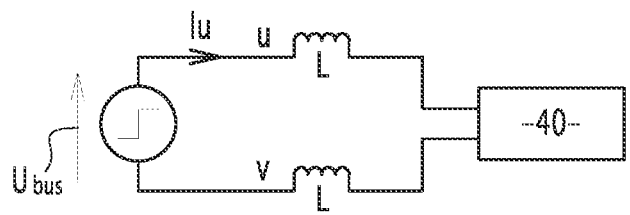
FIG. 2 is a simplified representation of the power supply chain in a first configuration for determining characteristic parameter(s) of the connection set.

Accordingly, the generated voltage pulse 54 will flow through the electromagnetic coil 44 connected to said respective output terminal 26, the cable 40 and then back through the electromagnetic coil 44 connected to said another output terminal 26, as shown in FIG. 2. In the example of FIG. 2, the respective output terminal 26 is the output terminal denoted U, said another output terminal 26 is the output terminal denoted V, and the converter 14 is the two-level converter of FIG. 1, the amplitude A of the voltage pulse 54 being equal to Ubus.

The acquisition module 56 is then, after the generation of the voltage pulse 54, configured to acquire respective measurements of the current Iu, Iv, Iw through the electromagnetic coil 44 connected to said respective output terminal 26, of the voltage Uu, Uv, Uw in the respective connection point 48 for said respective output terminal 26 and of the voltage Uv or Uw, Uu or Uw, Uu or Uv in the respective connection point 48 for said another output terminal 26.

When the characteristic parameter to be determined is the inductance L, the acquisition module 56 is further configured to acquire a measurement of the voltage Ubus between the first V+ and second V− input terminals.

Figure 3:
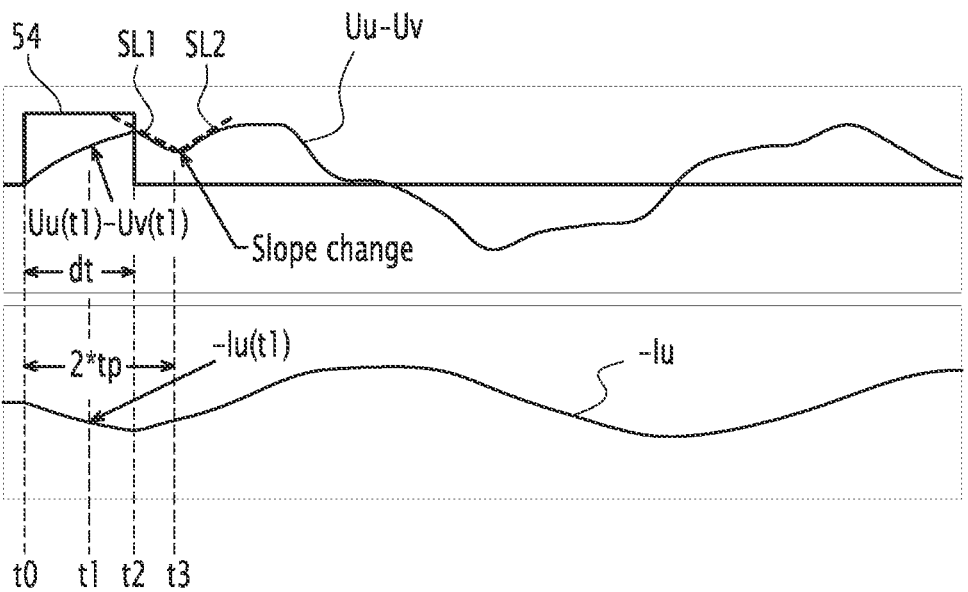
FIG. 3 is a view representing curves of voltages and current in the connection set in the first configuration according to a first variant.
Figure 4:
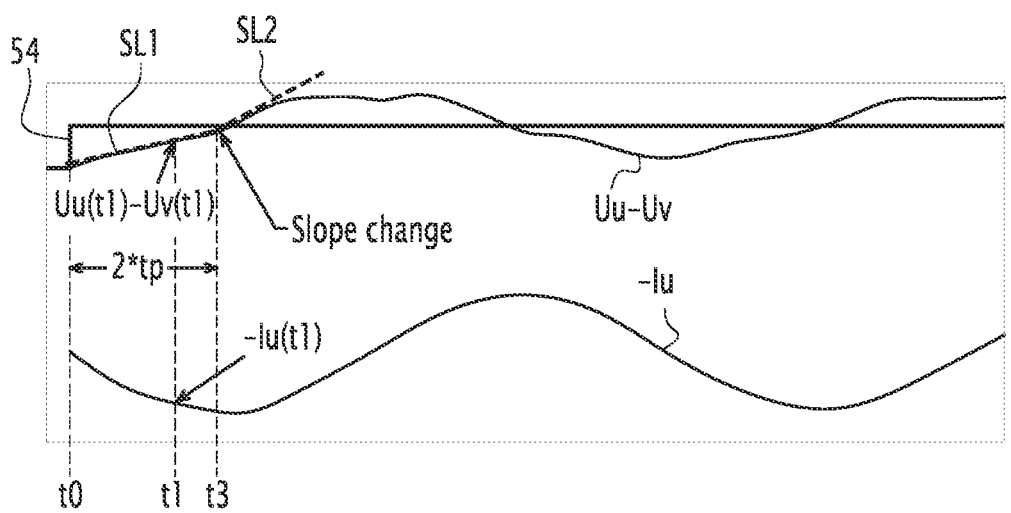
FIG. 4 is a view similar to FIG. 3 according to a second variant.

The calculation module 58 is then configured to calculate the characteristic impedance $Z_0$ and/or the inductance L according to said respective acquired measurements at a time instant t1, t1m after the generation of the voltage pulse 54, as shown in FIGS. 3 and 4 for the examples of current Iu and voltages Uu, Uv.

The calculation module 58 is for example configured to calculate the characteristic impedance $Z_0$ of a respective conductor 42 of the cable 40 according to the following equation:

$$Zo = \frac{Uu(t1) - Uv(t1)}{Iu(t1)} \quad (2)$$

where $Z_0$ represents the characteristic impedance of the respective conductor 42, Uu represents the voltage in the respective connection point 48 for said output terminal 26

Uv represents the voltage in the respective connection point 48 for said another output terminal 26, Iu represents the current through the coil 44 connected to said output terminal 26, and t1 represents a time instant after the generation of the voltage pulse 54.

The calculation module 58 is for example configured to calculate the inductance L of a respective electromagnetic coil 44 of the filter 38 according to the following equation:

$$L = \frac{Ubus(t1m) - (Uu(t1m) - Uv(t1m))}{2 \cdot Iu(t1m)} t1m \quad (3)$$

where L represents the inductance of the respective electromagnetic coil 44,

Uu represents the voltage in the respective connection point 48 for said output terminal 26

Uv represents the voltage in the respective connection point 48 for said another output terminal 26, Ubus represents the voltage between the first V+ and second V− input terminals, and t1m represents a time instant after the generation of the voltage pulse 54;

said time instant t1m verifying preferably the following condition:

$$t1m - t0 \leq \frac{Li}{Zo\_ref} \quad (4)$$

where t0 represents the time instant of the generation of the voltage pulse 54,

Li represents a predefined initial value of the inductance of the respective electromagnetic coil 44, and $Z_{0\_ref}$ represents a predefined reference value of the characteristic impedance of the respective conductor 42.

Alternatively, the calculation module 58 is configured to calculate said inductance L according to the following equation:

$$L = \frac{t1 \cdot Zo}{2 \cdot \ln\left(\frac{1}{1 - \frac{Uu(t1) - Uv(t1)}{Ubus(t1)}}\right)} \quad (5)$$

where L represents the inductance of the respective electromagnetic coil 44, $Z_O$ represents the characteristic impedance of the respective conductor 42, Uu represents the voltage in the respective connection point 48 for said output terminal 26

Uv represents the voltage in the respective connection point 48 for said another output terminal 26, Ubus represents the voltage between the first V+ and second V− input terminals, ln represents the natural logarithm, and t1 represents a time instant after the generation of the voltage pulse 54;

said time instant t1 verifying preferably the following condition:

$$t1-t0 \leq 2 \cdot Tp\_ref \quad (6)$$

where t0 represents the time instant of the generation of the voltage pulse 54, and Tp_ref represents a predefined propagation time associated to the respective conductor 42 of the cable 40.

For calculating the propagation time Tp, the calculation module 58 is for example configured to detect a time instant t3 of a slope change for a voltage difference Ui−Uj (with i index equal to u, v or w and j index equal to u, v or w while differing from i) equal to the voltage Uu, Uv, Uw in the respective connection point 48 for said output terminal 26 minus the voltage Uv or Uw, Uu or Uw, Uu or Uv in the respective connection point 48 for said another output terminal 26, said slope change occurring after the generation of the voltage pulse 54.

FIGS. 3 and 4 respectively illustrate said slope change between a first slope SL1 and a second slope SL2, for two respective cases. In a first case where the voltage pulse 54 is switched off at a time instant t2, subsequent to the generation of the voltage pulse 54, the time instant t2 being preferably greater than the time instant t1, the first slope SL1 is negative, and the second slope SL2 is then positive. In a second case where the voltage pulse 54 is not switched off, the first slope SL1 and the second slope SL2 are both positive, the first slope SL1 being smaller than the second slope SL2.

Further, the calculation module 58 is for example configured to calculate the propagation time Tp associated to a respective conductor 42 of the cable 40 according to the following equation:

$$Tp = \frac{(t3 - t0)}{2} \quad (7)$$

where Tp represents the propagation time associated to the respective conductor 42 of the cable 40, t0 represents the time instant of the generation of the voltage pulse 54, and t3 represents the time instant of the slope change for the voltage difference Ui−Uj;

In addition, the calculation module 58 is for example configured to calculate the parasitic capacitance Cc of the respective conductor 42 of the cable 40 according to the following equation:

$$Cc = \frac{Tp}{Zo} \quad (8)$$

where Cc represents the parasitic capacitance of the respective conductor 42 of the cable 40, Tp represents the propagation time associated to the respective conductor 42 of the cable 40, and $Z_O$ represents the characteristic impedance of the respective conductor 42, for example calculated according to equation (2).

Figure 13:
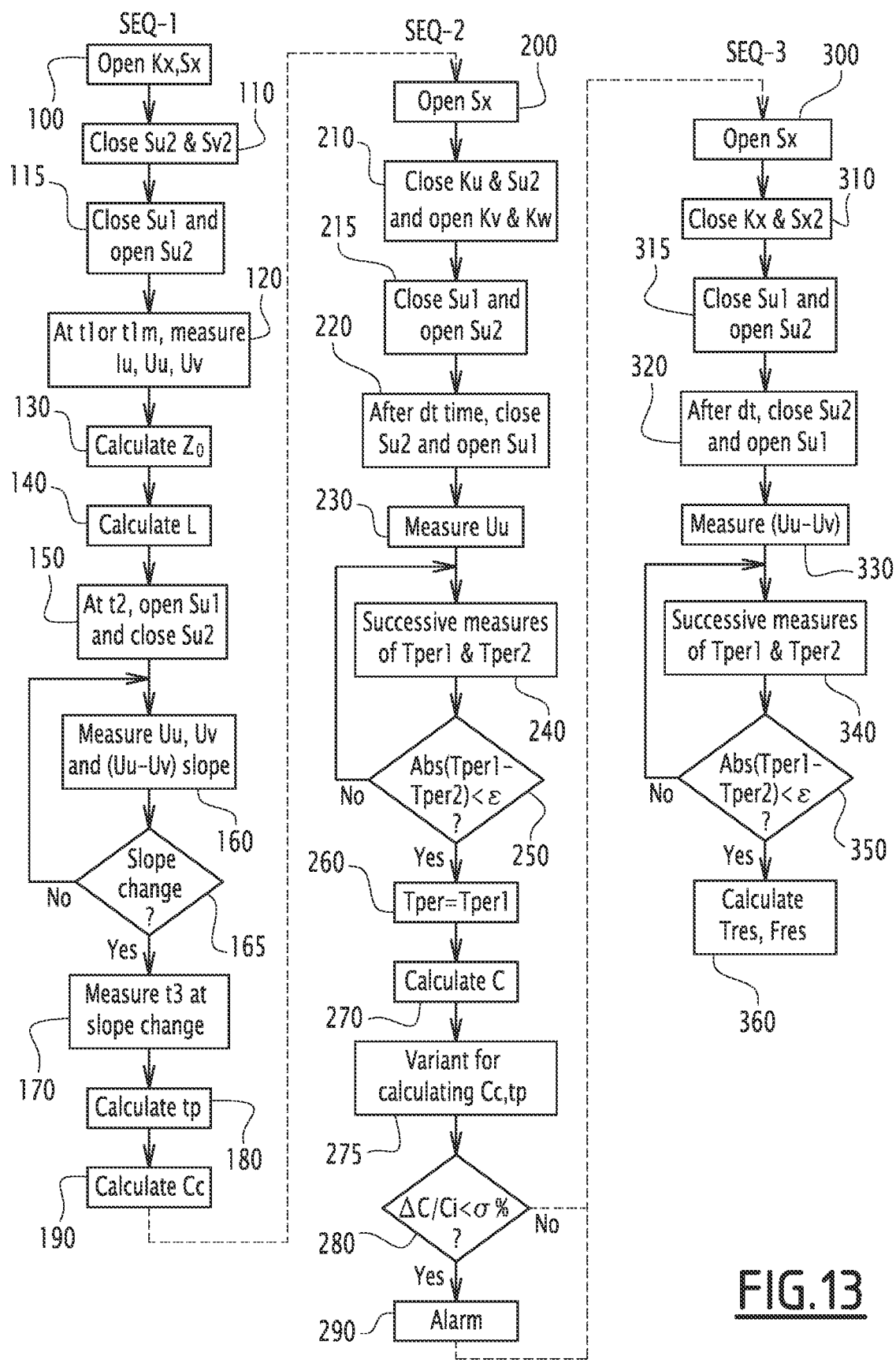
FIG. 13 is a flowchart of a determination method according to the invention, for determining at least one characteristic parameter of the connection set, the method being implemented by the determination device of FIG. 1.

The operation of the power supply chain 10, in particular the determination device 20, for the calculation of the characteristic impedance $Z_O$, the inductance L, the propagation time Tp and/or the parasitic capacitance Cc will now be explained in view of FIG. 13 representing a flowchart of a method for determining the at least one characteristic parameter $Z_O$, Tp, Cc, L, C, $F_{res}$ of the connection set 18, in particular in view of a first sequence SEQ-1.

The first sequence SEQ-1 illustrates the determination method when at least one characteristic parameter to be determined is among the aforementioned characteristic impedance $Z_O$, inductance L, propagation time Tp and parasitic capacitance Cc, in the examples of FIGS. 2 to 4 wherein the respective output terminal 26 is the output terminal denoted U, the another output terminal 26 is the output terminal denoted V, and the converter 14 is the two-level converter of FIG. 1.

In initial step 100, before the generation of the voltage pulse 54 through a respective output terminal 26, the determination device 20 controls, via its generation module 52, all the device switches 50 (also denoted Kx, x being a variable representing the respective phases u, v, w) and all the converter switch(es) 36 (also denoted Sx) to open.

In the next step 110, the determination device 20 controls, via its generation module 52, the converter switch(es) 36 of the second switching half-branch 32 for the respective output terminal 26 and the converter switch(es) 36 of the second switching half-branch 32 for one output terminal 26 other than said respective output terminal 26 to close. In the examples of FIGS. 2 to 4 wherein the respective output terminal 26 is the output terminal U and the other output terminal 26 is the output terminal V, the generation module 52 therefore controls the converter switches Su2 and Sv2 to close.

Then, in order to generate the voltage pulse 54 at the respective output terminal 26, the determination device 20 controls, in next step 115 and via its generation module 52, the converter switch 36 of the first switching half-branch 30 for the respective output terminal 26 to close and the converter switch 36 of the second switching half-branch 32 for said respective output terminal 26 to open. In the examples of FIGS. 2 to 4, the generation module 52 therefore controls the converter switch Su1 to close and the converter switch Su2 to open.

In next step 120, at the time instant t1, respectively t1m, after the generation of the voltage pulse 54, the determination device 20 acquires, via its acquisition module 56, respective measurements of the current Iu, Iv, Iw through the electromagnetic coil 44 connected to said respective output terminal 26, of the voltage Uu, Uv, Uw in the respective connection point 48 for said respective output terminal 26 and of the voltage Uv or Uw, Uu or Uw, Uu or Uv in the respective connection point 48 for said another output terminal 26. In the examples of FIGS. 2 to 4, the acquisition module 56 therefore acquires respective measurements of the current Iu, of the voltage Uu, and of the voltage Uv.

Then, the determination device 20 calculates, via its calculation module 58, the characteristic impedance $Z_O$ of a respective conductor 42 of the cable 40, in next step 130 and according to equation (2); and the inductance L of a respective electromagnetic coil 44 of the filter 38, in next step 140 and according to equation (3) or (5). In the examples of FIGS. 2 to 4, the calculation module 58 calculates the characteristic impedance $Z_0$ of the respective conductor 42 associated to the phase u and the inductance L of the electromagnetic coil 44 associated to said phase u.

Optionally, in order to switch off the voltage pulse 54 at the aforementioned time instant t2, the determination device 20 controls, in next step 150 and via its generation module 52, the converter switch 36 of the first switching half-branch 30 for the respective output terminal 26 to open and the converter switch 36 of the second switching half-branch 32 for said respective output terminal 26 to close. In the examples of FIGS. 2 to 4, the generation module 52 therefore controls the converter switch Su1 to open and the converter switch Su2 to close.

In next step 160, after the time instant t2, the determination device 20 acquires, via its acquisition module 56, respective measurements of the voltage Uu, Uv, Uw in the respective connection point 48 for said respective output terminal 26 and of the voltage Uv or Uw, Uu or Uw, Uu or Uv in the respective connection point 48 for said another output terminal 26, so as to calculate a slope of the voltage difference Ui−Uj. In the examples of FIGS. 2 to 4, the acquisition module 56 therefore acquires respective measurements of the voltage Uu, and of the voltage Uv, so as to calculate a slope of the voltage difference (Uu−Uv), during the step 160.

The determination device 20 then tests, in next 165 and via its acquisition module 56, if there is a slope change for the voltage difference Ui−Uj, i.e. if the slope of the voltage difference Ui−Uj varies from the first slope SL1 to the second slope SL2.

If the test is positive, i.e. if the slope change has been detected by the acquisition module 56, then the acquisition module 56 measures the time instant t3 of the slope change for the voltage difference Ui−Uj, namely the slope change for the voltage difference Uu−Uv in the examples of FIGS. 2 to 4.

Otherwise, if the test is negative, i.e. if the slope change has not been detected by the acquisition module 56, then the acquisition module 56 goes back to step 160 for acquiring the respective measurements a subsequent time instant.

After the measurement of the time instant t3 of the slope change in step 170, the determination device 20 calculates, via its calculation module 58, the propagation time Tp associated to a respective conductor 42 of the cable 40, in next step 180 and according to equation (7); and the parasitic capacitance Cc of the respective conductor 42 of the cable 40, in next step 190 and according to equation (8). In the examples of FIGS. 2 to 4, the calculation module 58 calculates the propagation time Tp associated to a respective conductor 42 associated to the phase u and the parasitic capacitance Cc of the respective conductor 42 associated to said phase u. The step 190 is the last step of the first sequence SEQ-1.

At the end of the first sequence SEQ-1, the determination device 20 can either branch to a second sequence SEQ-2 concerning the calculation of the capacitance C, and/or an alternative calculation of the propagation time Tp and/or the parasitic capacitance Cc, or to a third sequence SEQ-3 concerning the calculation of the resonance frequency $F_{res}$, or else go back to the initial step 100 of the first sequence SEQ-1 for calculating new value(s) of the characteristic impedance $Z_0$, inductance L, propagation time Tp and/or parasitic capacitance Cc, for another phase v, w or for the same phase u.

Calculation of the Capacitance C and Alternative Calculation of the Propagation Time Tp and/or the Parasitic Capacitance Cc When at least one characteristic parameter to be determined is among the aforementioned capacitance C, propagation time Tp and parasitic capacitance Cc, the generation module 52 is further configured, before the generation of the voltage pulse 54 through a respective output terminal 26, to control the device switch 50 for said respective output terminal 26 to close, the device switch(es) 50 for output terminals 26 other than said respective output terminal 26 to open, the converter switch(es) 36 of the second switching half-branch 32 for said respective output terminal 26 to close, and the converter switch(es) 36 of the other switching half-branches to open.

Figure 5:
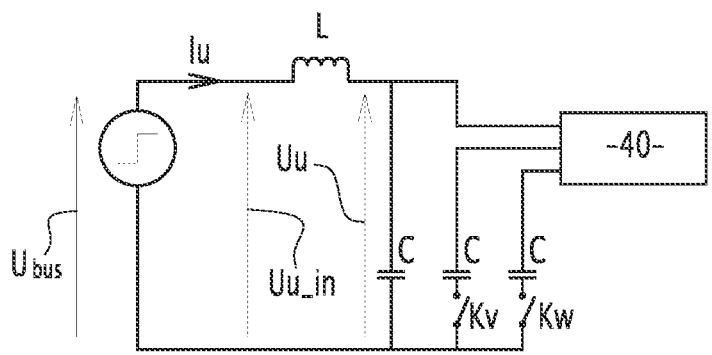
FIG. 5 is a view similar to FIG. 2 in a second configuration for determining another characteristic parameter of the connection set.
Figure 7:
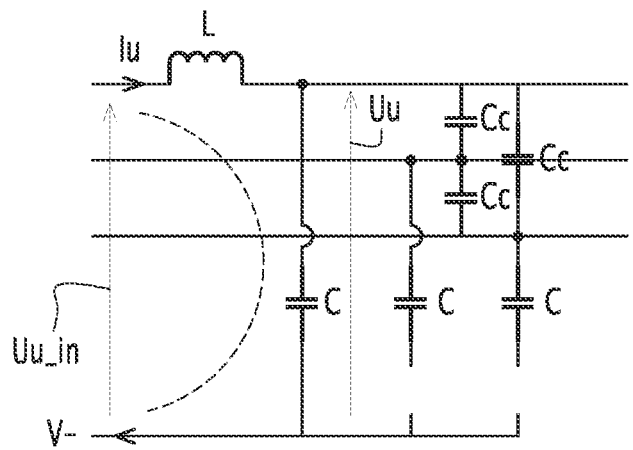
FIG. 7 is an equivalent scheme of the connection set in the second configuration.

Accordingly, the generated voltage pulse 54 will flow through the electromagnetic coil 44 connected to said respective output terminal 26, and then both through the cable 40 and the capacitor 46 associated to said respective output terminal 26, as shown in FIGS. 5 and 7. In the example of FIGS. 5 and 7, the respective output terminal 26 is the output terminal denoted U, and the converter 14 is the two-level converter of FIG. 1, the amplitude A of the voltage pulse 54 being equal to Ubus.

The generation module 52 is further configured, after a predefined time period dt further to the generation of the voltage pulse 54 through said respective output terminal 26, to control the respective converter switches 36 of the switching half-branches for said output terminal 26, to switch off the voltage pulse 54.

The acquisition module 56 is then configured to acquire, after the predefined time period dt, respective measurements of a current Iu; Iv; Iw through the electromagnetic coil 44 connected to said output terminal 26 and/or of a voltage Uu; Uv; Uw in the respective connection point 48 for said output terminal 26.

The calculation module 58 is for example configured to calculate the capacitance C of a respective capacitor 46 of the filter 38 according to the following equation:

$$C = \left(\frac{Tper}{2\pi}\right)^2 \cdot \frac{1}{L} \qquad (9)$$

where C represents the capacitance of the respective capacitor 46 of the filter 38, Tper represents the period of the current Iu; Iv; Iw through the electromagnetic coil 44 connected to said output terminal 26 or of the voltage Uu; Uv; Uw in the respective connection point 48 for said output terminal 26, and L represents the inductance of the respective electromagnetic coil 44.

Figure 6:
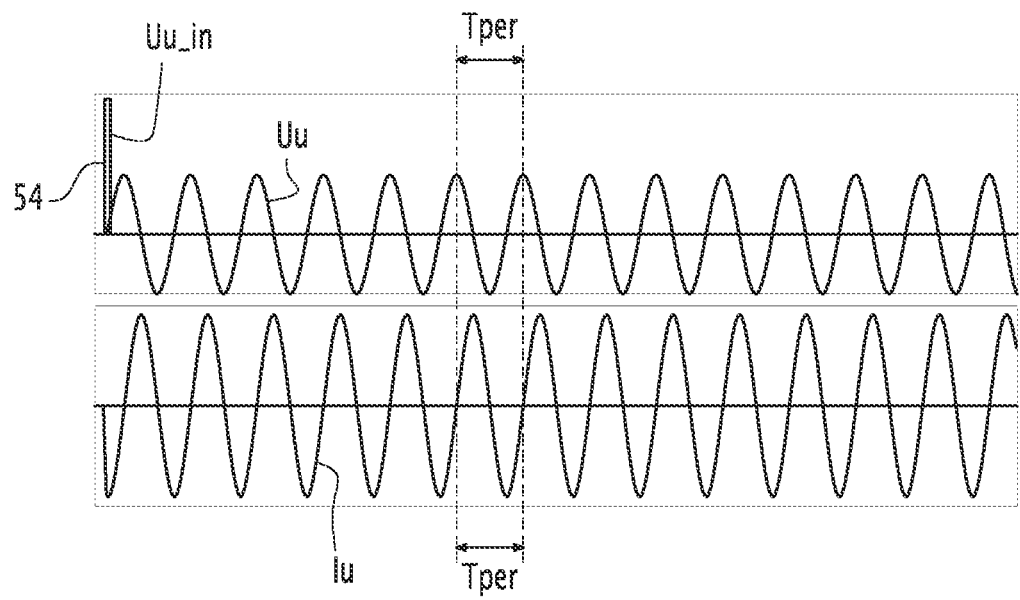
FIG. 6 is a view representing curves of voltages and current in the connection set in the second configuration.

The period Tper is shown in FIG. 6 for the examples of current Iu and voltage Uu.

As an alternative to the aforementioned calculation of the parasitic capacitance Cc, the calculation module 58 is configured to calculate the parasitic capacitance Cc of a respective conductor 42 of the cable 40 according to the following equation:

$$Cc = \frac{2}{3}C \cdot \frac{C - Ceq}{Ceq - 2 \cdot C} \qquad (10)$$

where Cc represents the parasitic capacitance of the respective conductor 42 of the cable 40, C represents the capacitance of the respective capacitor 46 of the filter 38, and Ceq is defined according to the following equation:

$$Ceq = \left(\frac{Tper}{2\pi}\right)^2 \cdot \frac{1}{L} \tag{11}$$

where Tper represents the period of the current Iu; Iv; Iw through the electromagnetic coil 44 connected to said output terminal 26 or of the voltage Uu; Uv; Uw in the respective connection point 48 for said output terminal 26, and L represents the inductance of the respective electromagnetic coil 44;

As an alternative to the aforementioned calculation of the propagation time Tp, the calculation module 58 is configured to calculate the propagation time Tp associated to the respective conductor 42 of the cable 40 according to the following equation:

$$Tp = Cc \cdot Zo \tag{12}$$

where Tp represents the propagation time associated to the respective conductor 42 of the cable 40, Cc represents the parasitic capacitance of the respective conductor 42 of the cable 40, and $Z_0$ represents the characteristic impedance of the respective conductor 42, for example calculated according to equation (2).

As another alternative to the aforementioned calculation of the parasitic capacitance Cc and/or the propagation time Tp, the period Tper used in equation (11) represents the period of the voltage difference Uu–Uv, Uu–Uw; Uv–Uu, Uv–Uw; Uw–Uu, Uw–Uv equal to the voltage Uu; Uv; Uw in the respective connection point 48 for said output terminal 26 minus the voltage Uv, Uw; Uu, Uw; Uu, Uv in the respective connection point 48 for said another output terminal 26.

According to said another alternative, the generation module 52 is configured, before the generation of the voltage pulse 54 through a respective output terminal 26, to control the device switch 50 for said respective output terminal 26 and the device switch 50 for one output terminal 26 other than said respective output terminal 26 to close, the other device switch(es) 50 to open, the converter switch(es) 36 of the second switching half-branch 32 for said respective output terminal 26 to close, and the converter switch(es) 36 of the other switching half-branches to open.

Figure 8:
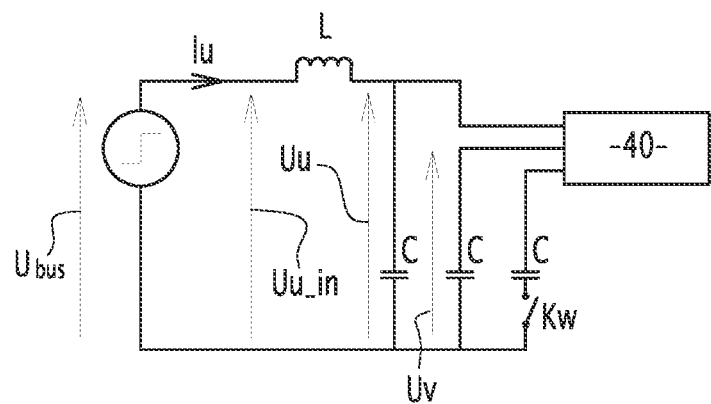
FIG. 8 is a view similar to FIG. 2 in a third configuration for determining other characteristic parameter(s) of the connection set.
Figure 9:
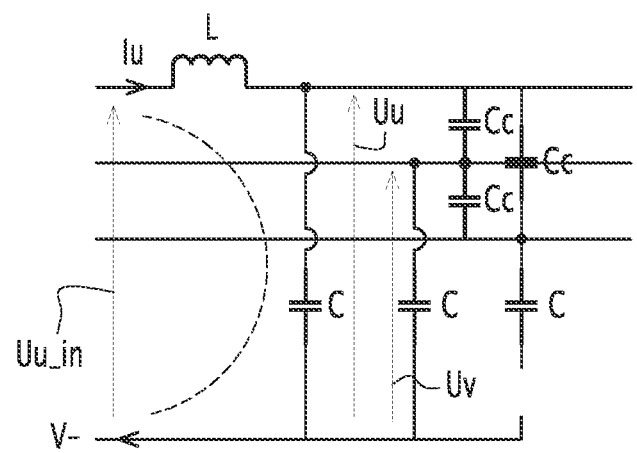
FIG. 9 is an equivalent scheme of the connection set in the third configuration.

Accordingly, the generated voltage pulse 54 will flow through the electromagnetic coil 44 connected to said respective output terminal 26, and then through the cable 40, the capacitor 46 associated to said respective output terminal 26 and also the capacitor 46 associated to said other output terminal 26, as shown in FIGS. 8 and 9. In the example of FIGS. 8 and 9, the respective output terminal 26 is the output terminal U, the other output terminal 26 is the output terminal V and the converter 14 is the two-level converter of FIG. 1, the amplitude A of the voltage pulse 54 being equal to Ubus.

The generation module 52 is further configured, after the predefined time period dt further to the generation of the voltage pulse 54 through said respective output terminal 26, to control the respective converter switches 36 of the switching half-branches for said output terminal 26, to switch off the voltage pulse 54.

The acquisition module 56 is then configured to acquire, after the predefined time period dt, respective measurements of a voltage Uu; Uv; Uw in the respective connection point 48 for said respective output terminal 26 and of a voltage Uu; Uv; Uw in the respective connection point 48 for said other output terminal 26.

The calculation module 58 is for example configured to calculate the parasitic capacitance Cc according to equations (10) and (11) and/or the propagation time Tp according to equation (12).

The operation of the power supply chain 10, in particular the determination device 20, for the calculation of the capacitance C, the propagation time Tp and/or the parasitic capacitance Cc will now be explained in view of FIG. 13 representing a flowchart of a method for determining the at least one characteristic parameter $Z_0$, Tp, Cc, L, C, $F_{res}$ of the connection set 18, in particular in view of the second sequence SEQ-2.

The second sequence SEQ-2 illustrates the determination method when at least one characteristic parameter to be determined is among the aforementioned capacitance C, propagation time Tp and/or parasitic capacitance Cc, in the examples of FIGS. 5 to 9 wherein the respective output terminal 26 is the output terminal denoted U, the another output terminal 26 is the output terminal denoted V, and the converter 14 is the two-level converter of FIG. 1.

In initial step 200 of the second sequence SEQ-2, before the generation of the voltage pulse 54 through a respective output terminal 26, the determination device 20 controls, via its generation module 52, all the device switches 50 (also denoted Kx,) and all the converter switch(es) 36 (also denoted $S_X$) to open.

In the next step 210, the determination device 20 controls, via its generation module 52, the device switch 50 for said respective output terminal 26 to close, the device switch(es) 50 for output terminals 26 other than said respective output terminal 26 to open, the converter switch(es) 36 of the second switching half-branch 32 for said respective output terminal 26 to close, and the converter switch(es) 36 of the other switching half-branches to open. In the examples of FIGS. 5 to 7 wherein the respective output terminal 26 is the output terminal U and the other output terminal 26 is the output terminal V, the generation module 52 therefore controls the device switch Ku and the converter switch Su2 to close; and the device switches Kv and Kw to open.

Then, in order to generate the voltage pulse 54 at the respective output terminal 26, the determination device 20 controls, in next step 215 and via its generation module 52, the converter switch 36 of the first switching half-branch 30 for the respective output terminal 26 to close and the converter switch 36 of the second switching half-branch 32 for said respective output terminal 26 to open. In the examples of FIGS. 5 to 9, the generation module 52 therefore controls the converter switch Su1 to close and the converter switch Su2 to open.

In next step 220, after the predefined time period dt further to the generation of the voltage pulse 54, the determination device 20 switches off the voltage pulse 54 by controlling, via its generation module 52, the converter switch 36 of the first switching half-branch 30 for the respective output terminal 26 to open and the converter switch 36 of the second switching half-branch 32 for said respective output terminal 26 to close. In the examples of FIGS. 5 to 9, the generation module 52 therefore controls the converter switch Su1 to open and the converter switch Su2 to close.

Then, the determination device 20 acquires, in next step 230 and via its acquisition module 56, respective measurements of the current Iu, Iv, Iw through the electromagnetic coil 44 connected to said respective output terminal 26 and/or of the voltage Uu, Uv, Uw in the respective connection point 48 for said respective output terminal 26. In the examples of FIGS. 5 to 9, the acquisition module 56 therefore acquires respective measurements of the current Iu and/or of the voltage Uu.

In next step 240, the determination device 20 computes, via its acquisition module 56, successive values denoted Tper1, Tper2 of the period of the current Iu; Iv; Iw through the electromagnetic coil 44 connected to said output terminal 26 or of the voltage Uu; Uv; Uw in the respective connection point 48 for said output terminal 26.

The determination device 20 then tests, in next step 250 and via its acquisition module 56, if the difference between these successive values Tper1 and Tper2 is, in absolute value, less than a threshold c of low value. The threshold c is for example comprised between 0.5 µs and 2 µs.

If the test is positive, i.e. if the successive values Tper1 and Tper2 are close enough to consider that the value of the period Tper is stabilized, then the acquisition module 56 sets, in next step 260, the period Tper equal to one of the last successive acquired values Tper1 and Tper2, for example Tper1.

Otherwise, if the test is negative, i.e. if the successive values Tper1 and Tper2 are not close enough to consider that the value of the period Tper is stabilized, then the acquisition module 56 goes back to step 240 for computing subsequent successive values Tper1, Tper2.

After setting the period Tper, the determination device 20 calculates, via its calculation module 58, the capacitance C of a respective capacitor 46 of the filter 38 in next step 270 and according to equation (9).

In next step 275, as an alternative to the aforementioned calculation of the parasitic capacitance Cc, the determination device 20 calculates, via its calculation module 58, the parasitic capacitance Cc according to equations (10) and (11), and/or the propagation time Tp according to equation (12).

As another alternative to the aforementioned calculation of the parasitic capacitance Cc and/or the propagation time Tp, the period Tper used in equation (11) represents the period of the voltage difference Ui–Uj equal to the voltage in the respective connection point 48 for said output terminal 26 minus the voltage in the respective connection point 48 for said another output terminal 26.

According to said another alternative, the generation module 52 controls, in step 210, the device switch 50 for said respective output terminal 26 and the device switch 50 for one output terminal 26 other than said respective output terminal 26 to close, the other device switch(es) 50 to open, the converter switch(es) 36 of the second switching half-branch 32 for said respective output terminal 26 to close, and the converter switch(es) 36 of the other switching half-branches to open. In the examples of FIGS. 8 and 9 wherein the respective output terminal 26 is the output terminal U and the other output terminal 26 is the output terminal V, the generation module 52 therefore controls the device switches Ku and Kv and the converter switch Su2 to close; and the device switch Kw to open.

After step 270 or 275, the determination device 20 then tests, in next step 280 and via its calculation module 58, whether the value of the capacitance C has dropped relative to a reference value Ci, for example using the following equation:

$$\frac{|Ci - C|}{Ci} < \sigma \ \% \quad (13)$$

where C represents the capacitance of the respective capacitor 46 of the filter 38, Ci represents the reference value Ci for said capacitance, and σ represents a percentage threshold value not to be exceeded.

For example, the reference value Ci is a predefined value or determined when the system is first commissioned. The percentage threshold value a is typically less than 20%.

If the test is negative, i.e. the value of the capacitance C has not dropped relative to the reference value Ci, then the determination device 20 ends the second sequence SEQ-2.

Otherwise, if the test is positive, i.e. the value of the capacitance C has dropped relative to the reference value Ci, then the determination device 20 triggers, in next step 290, an alarm to indicate an ageing of the respective capacitor 46 of the filter 38. Then, the determination device 20 ends the second sequence SEQ-2.

At the end of the second sequence SEQ-2, the determination device 20 can either branch to the third sequence SEQ-3 for calculating the resonance frequency $F_{res}$, or to the first sequence SEQ-1 for calculating the characteristic impedance $Z_0$, inductance L, propagation time Tp and/or parasitic capacitance Cc, or else go back to the initial step 200 of the second sequence SEQ-2 for calculating new value(s) of the capacitance C, the propagation time Tp and/or the parasitic capacitance Cc, for another phase v, w or for the same phase u.

Calculation of the Resonance Frequency $F_{res}$

When the characteristic parameter to be determined is the resonance frequency $F_{res}$, the generation module 52 is configured, before the generation of the voltage pulse 54 through a respective output terminal 26, to control the device switches 50 to close, and the converter switch(es) 36 of the second switching half-branch 32 for each output terminals 26 to close.

Figure 10:
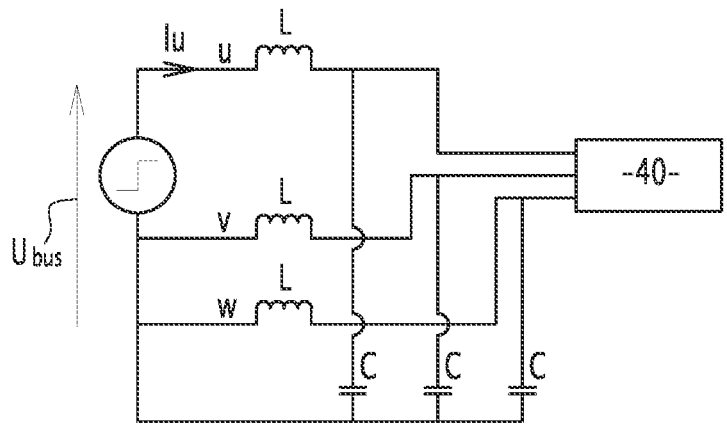
FIG. 10 is a view similar to FIG. 2 in a fourth configuration for determining another characteristic parameter of the connection set.
Figure 12:
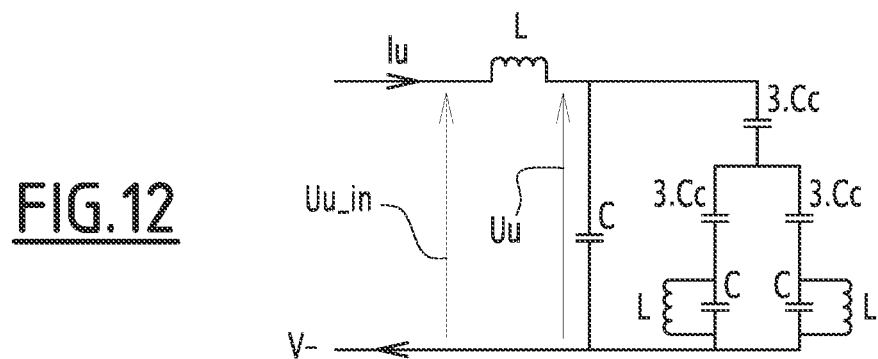
FIG. 12 is an equivalent scheme of the connection set in the fourth configuration.

Accordingly, the generated voltage pulse 54 will flow through each electromagnetic coil 44 and each capacitor 46 of the filter 38 and through the cable 40, as shown in FIGS. 10 and 12. In the example of FIGS. 10 and 12, the respective output terminal 26 is the output terminal denoted U, and the converter 14 is the two-level converter of FIG. 1, the amplitude A of the voltage pulse 54 being equal to Ubus.

The generation module 52 is further configured, after the predefined time period dt further to the generation of the voltage pulse 54 through said respective output terminal 26, to control the respective converter switches 36 of the switching half-branches for said output terminal 26 to switch off the voltage pulse 54.

The acquisition module 56 is then configured to acquire, after the predefined time period dt, respective measurements of a voltage Uu; Uv; Uw in the respective connection point 48 for said output terminal 26 and of a voltage Uv, Uw; Uu, Uw; Uu, Uv in the respective connection point 48 for said another output terminal 26.

The calculation module 58 is for example configured to calculate the resonance frequency $F_{res}$ of the connection set 18 according to the following equation:

$$Fres = \frac{1}{Tper} \quad (14)$$

where Fres represents the resonance frequency of the connection set 18,

Tper represents the period of a voltage difference Uu–Uv, Uu–Uw; Uv–Uu, Uv–Uw; Uw–Uu, Uw–Uv, said voltage difference being equal to the voltage Uu; Uv; Uw in the respective connection point 48 for said output terminal 26 minus the voltage Uv, Uw; Uu, Uw; Uu, Uv in the respective connection point 48 for said another output terminal 26.

The operation of the power supply chain 10, in particular the determination device 20, for the calculation of the resonance frequency $F_{res}$ will now be explained in view of FIG. 13 representing a flowchart of a method for determining the at least one characteristic parameter $Z_0$, Tp, Cc, L, C, $F_{res}$ of the connection set 18, in particular in view of the third sequence SEQ-3.

Figure 11:
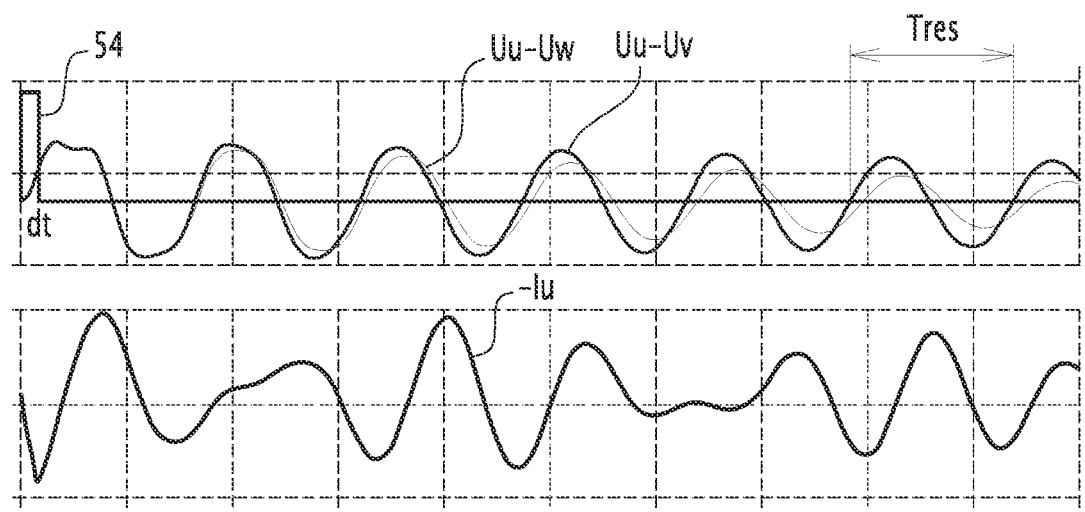
FIG. 11 is a view representing curves of voltages and current in the connection set in the fourth configuration.

The third sequence SEQ-3 illustrates the determination method when the characteristic parameter to be determined is the resonance frequency $F_{res}$, in the examples of FIGS. 10 to 12 wherein the respective output terminal 26 is the output terminal denoted U and the converter 14 is the two-level converter of FIG. 1.

In initial step 300 of the third sequence SEQ-3, before the generation of the voltage pulse 54 through a respective output terminal 26, the determination device 20 controls, via its generation module 52, all the converter switch(es) 36 (also denoted Sx) to open.

In the next step 310, the determination device 20 controls, via its generation module 52, control all the device switches 50 (also denoted Kx) to close, and the converter switch(es) 36 of the second switching half-branch 32 for each output terminals 26 to close. In the examples of FIGS. 10 to 12, the generation module 52 therefore controls the device switches Kx and the converter switches Sx2 to close.

Then, in order to generate the voltage pulse 54 at the respective output terminal 26, the determination device 20 controls, in next step 315 and via its generation module 52, the converter switch 36 of the first switching half-branch 30 for the respective output terminal 26 to close and the converter switch 36 of the second switching half-branch 32 for said respective output terminal 26 to open. In the examples of FIGS. 10 to 12, the generation module 52 therefore controls the converter switch Su1 to close and the converter switch Su2 to open.

In next step 320, after the predefined time period dt further to the generation of the voltage pulse 54, the determination device 20 switches off the voltage pulse 54 by controlling, via its generation module 52, the converter switch 36 of the first switching half-branch 30 for the respective output terminal 26 to open and the converter switch 36 of the second switching half-branch 32 for said respective output terminal 26 to close. In the examples of FIGS. 10 to 12, the generation module 52 therefore controls the converter switch Su1 to open and the converter switch Su2 to close.

Then, the determination device 20 acquires, in next step 330 and via its acquisition module 56, respective measurements of the voltage difference Ui–Uj equal to the voltage Uu, Uv, Uw in the respective connection point 48 for said output terminal 26 minus the voltage Uv or Uw, Uu or Uw, Uu or Uv in the respective connection point 48 for said another output terminal 26. In the examples of FIGS. 10 to 12, the acquisition module 56 therefore acquires respective measurements of the voltage difference Uu–Uv.

In next step 340, the determination device 20 computes, via its acquisition module 56, successive values denoted Tper1, Tper2 of the period of said voltage difference Ui–Uj for said respective output terminal 26.

The determination device 20 then tests, in next step 350 and via its acquisition module 56, if the difference between these successive values Tper1 and Tper2 is, in absolute value, less than the threshold ε.

If the test is positive, i.e. if the successive values Tper1 and Tper2 are close enough to consider that the value of the period Tper is stabilized, then the acquisition module 56 sets the period Tper equal to one of the last successive acquired values Tper1 and Tper2, for example Tper1, and goes to next step 360.

Otherwise, if the test is negative, i.e. if the successive values Tper1 and Tper2 are not close enough to consider that the value of the period Tper is stabilized, then the acquisition module 56 goes back to step 340 for computing subsequent successive values Tper1, Tper2.

After setting the period Tper, the determination device 20 calculates, via its calculation module 58, the resonance frequency $F_{res}$ of the filter 38 in step 360 and according to equation (14). In this case, the period Tper is also called resonance period and denoted Tres.

At the end of the third sequence SEQ-3, the determination device 20 can either branch to the first sequence SEQ-1 for calculating the characteristic impedance $Z_0$, inductance L, propagation time Tp and/or parasitic capacitance Cc, or to the second sequence SEQ-2 for calculating the capacitance C, the propagation time Tp and/or the parasitic capacitance Cc, or else go back to the initial step 300 of the third sequence SEQ-3 for calculating new value(s) of t the resonance frequency $F_{res}$.

The first sequence SEQ-1, the second sequence SEQ-2 and the third sequence SEQ-3 are typically repeated for each output terminal 26, namely for the output terminals V and W. In other words, the first sequence SEQ-1, the second sequence SEQ-2 and the third sequence SEQ-3 are preferably carried out for each output terminal 26 of the converter 14, i.e. for each phase u, v, w.

The determination method is carried out at the start of the power supply chain 10 and is repeatable regularly, for example at a frequency defined by the user.

For example, in the case where the humidity and temperature vary greatly over a day, then the determination method can be performed two to three times a day to adjust the elements of the power supply chain 10, such as the capacitance value C of respective capacitors 46 of the filter 38, the parasitic capacitance Cc of respective conductors 42 the cable 40 and/or the resonance frequency $F_{res}$ of the connection set 18.

Another example is the detection of ageing of elements of the power supply chain 10, in particular of the connection set 18, in particular the detection of the ageing of capacitor(s) 46 of the filter 38. Accordingly, the determined characteristic parameter(s) $Z_0$, Tp, Cc, L, C, $F_{res}$ of the connection set 18 are stored regularly in a database, for example periodically, e.g. monthly. The evolution of the determined characteristic parameter(s) is thus evaluated to identify a possible change in values and also the rate of evolution to anticipate an ageing of the elements of the filter 38 and the cable 40.

Another use of the determination device 20 and the determination method according to the invention is the location of a break of the cable 40 according the determined propagation time Tp.

Thus, the electronic determination device 20 and the determination method according to the invention allow an easier and more convenient determination of the characteristic parameter(s) $Z_0$, Tp, Cc, L, C, $F_{res}$.

The invention claimed is:

1. An electronic determination device for determining at least one characteristic parameter of a connection set connected between a converter and an electric machine, the converter including first and second input terminals, at least two output terminals and, for each output terminal, a switching branch with first and second switching half-branches connected in series between the two input terminals and connected to each other at an intermediate point, the first switching half-branch being connected to the first input terminal and the second switching half-branch being connected to the second input terminal, the intermediate point being connected to said output terminal, each switching half-branch including at least one converter switch;

the connection set including a filter connected to the output terminals and a cable connected between the filter and the electric machine; the cable including, for each output terminal, a respective electrical conductor; the filter including, for each output terminal, a respective electromagnetic coil connected to said output terminal and a respective capacitor connected to said coil in a connection point, in derivation with respect to said coil and to the respective conductor of the cable;

the electronic determination device comprising:
for each output terminal, a device switch configured to be connected to the respective capacitor;
a generation module configured to generate a voltage pulse through the connection set, by controlling the converter switches and each device switch;
an acquisition module configured to acquire measurements of respective current(s) and voltage(s) through the filter, further to the generation of the respective voltage pulse; and
a calculation module configured to calculate at least one characteristic parameter of the connection set according to the respective current(s) and voltage(s) measurements, wherein the at least one characteristic parameter comprises:
a characteristic impedance of a respective conductor of the cable;
a propagation time associated to a respective conductor of the cable;
a parasitic capacitance of a respective conductor of the cable;
an inductance of a respective electromagnetic coil of the filter;
a resonance frequency of the connection set, or
a combination thereof.

2. The electronic determination device according to claim 1, wherein the generation module is configured to generate the voltage pulse through a respective output terminal, by controlling:
a respective converter switch of the first switching half-branch for said output terminal to close, and
a respective converter switch of the second switching half-branch for said output terminal to open,
with the respective converter switch of said first switching half-branch being initially open and the respective converter switch of said second switching half-branch being initially closed before said controlling.

3. The electronic determination device according to claim 1, wherein if the at least one characteristic parameter is among a characteristic impedance of a respective conductor of the cable, an inductance of a respective electromagnetic coil of the filter, a propagation time associated to a respective conductor of the cable and a parasitic capacitance of a respective conductor of the cable, the generation module is configured, before the generation of the voltage pulse through a respective output terminal, to control:
the device switches to open, and
the converter switch(es) of the second switching half-branch for one output terminal other than said output terminal to close; and
wherein the acquisition module is configured to acquire respective measurements of a current through the electromagnetic coil connected to said output terminal, of a voltage in the respective connection point for said output terminal and of a voltage in the respective connection point for said another output terminal.

4. The electronic determination device according to claim 3, wherein the calculation module is configured to calculate the characteristic impedance of a respective conductor of the cable and/or the inductance of a respective electromagnetic coil of the filter according to respective measurements, at a time instant after the generation of the voltage pulse, of the current through the electromagnetic coil connected to said output terminal, of the voltage in the respective connection point for said output terminal and of the voltage in the respective connection point for said another output terminal.

5. The electronic determination device according to claim 4, wherein the acquisition module is configured to acquire a measurement of a voltage between the first and second input terminals, and
wherein the calculation module is configured to calculate the inductance of a respective electromagnetic coil of the filter according to the following equation:

$$L = \frac{Ubus(t1m) - (Uu(t1m) - Uv(t1m))}{2 \cdot Iu(t1m)} t1m$$

where L represents the inductance of the respective electromagnetic coil,
Uu represents the voltage in the respective connection point for said output terminal (26),
Uv represents the voltage in the respective connection point for said another output terminal,
Ubus represents the voltage between the first and second input terminals, and
t1$m$ represents a time instant after the generation of the voltage pulse.

6. The electronic determination device according to claim 4, wherein the acquisition module is configured to acquire a measurement of a voltage between the first and second input terminals, and
wherein the calculation module is configured to calculate the inductance of a respective electromagnetic coil of the filter according to the following equation:

$$L = \frac{t1 \cdot Zo}{2 \cdot \ln\left(\frac{1}{1 - \frac{Uu(t1) - Uv(t1)}{Ubus(t1)}}\right)}$$

where L represents the inductance of the respective electromagnetic coil,
$Z_O$ represents the characteristic impedance of the respective conductor,
Uu represents the voltage in the respective connection point for said output terminal, Uv represents the voltage in the respective connection point for said another output terminal, Ubus represents the voltage between the first and second input terminals, ln represents the natural logarithm, and t1 represents a time instant after the generation of the voltage pulse.

7. The electronic determination device according to claim 3, wherein the calculation module is configured to detect a time instant of a slope change for a voltage difference equal to the voltage in the respective connection point for said output terminal minus the voltage in the respective connection point for said another output terminal, said slope change occurring after the generation of the voltage pulse, and wherein the calculation module is configured to calculate the propagation time associated to a respective conductor of the cable according to the following equation:

$$Tp = \frac{(t3 - t0)}{2}$$

where Tp represents the propagation time associated to the respective conductor of the cable, t0 represents the time instant of the generation of the voltage pulse, and t3 represents the time instant of the slope change for the voltage difference.

8. An electronic determination device for determining at least one characteristic parameter of a connection set connected between a converter and an electric machine, the converter including first and second input terminals, at least two output terminals and, for each output terminal, a switching branch with first and second switching half-branches connected in series between the two input terminals and connected to each other at an intermediate point, the first switching half-branch being connected to the first input terminal and the second switching half-branch being connected to the second input terminal, the intermediate point being connected to said output terminal, each switching half-branch including at least one converter switch;

the connection set including a filter connected to the output terminals and a cable connected between the filter and the electric machine; the cable including, for each output terminal, a respective electrical conductor; the filter including, for each output terminal, a respective electromagnetic coil connected to said output terminal and a respective capacitor connected to said coil in a connection point, in derivation with respect to said coil and to the respective conductor of the cable;

the electronic determination device comprising:
for each output terminal, a device switch configured to be connected to the respective capacitor;

a generation module configured to generate a voltage pulse through the connection set, by controlling the converter switches and each device switch;

an acquisition module configured to acquire measurements of respective current(s) and voltage(s) through the filter, further to the generation of the respective voltage pulse; and a calculation module configured to calculate at least one characteristic parameter of the connection set according to the respective current(s) and voltage(s) measurements, wherein if the at least one characteristic parameter is a capacitance of a respective capacitor of the filter, the generation module is configured, before the generation of the voltage pulse through a respective output terminal, to control:
the device switch for said output terminal to close,
the device switch(es) for output terminal(s) other than said output terminal to open,
the converter switch(es) of the second switching half-branch for said output terminal to close, and
the converter switch(es) of the other switching half-branches to open;

the generation module being further configured, after a predefined time period further to the generation of the voltage pulse through said output terminal, to control the respective converter switches of the switching half-branches for said output terminal to switch off the voltage pulse;

wherein the acquisition module is configured to acquire, after the predefined time period, respective measurements of a current through the electromagnetic coil connected to said output terminal and/or of a voltage in the respective connection point for said output terminal.

9. The electronic determination device according to claim 1, wherein if the at least one characteristic parameter is among a propagation time associated to a respective conductor of the cable and a parasitic capacitance of a respective conductor of the cable, the generation module is configured, before the generation of the voltage pulse through a respective output terminal, to control:
the device switch for said output terminal and the device switch for one output terminal other than said output terminal to close,
the other device switch(es) to open,
the converter switch(es) of the second switching half-branch for said output terminal to close, and
the converter switch(es) of the other switching half-branches to open;

the generation module being further configured, after a predefined time period further to the generation of the voltage pulse through said output terminal, to control the respective converter switches of the switching half-branches for said output terminal to switch off the voltage pulse; and wherein the acquisition module is configured to acquire, after the predefined time period, respective measurements of a current through the electromagnetic coil connected to said output terminal and/or of a voltage in the respective connection point for said output terminal.

10. The electronic determination device according to claim 1, wherein if the at least one characteristic parameter is a resonance frequency of the connection set, the generation module is configured, before the generation of the voltage pulse through a respective output terminal, to control:
the device switches to close, and
the converter switch(es) of the second switching half-branch for each output terminal to close; and
the generation module being further configured, after a predefined time period further to the generation of the voltage pulse through said output terminal, to control the respective converter switches of the switching half-branches for said output terminal to switch off the voltage pulse; and wherein the acquisition module is configured to acquire, after the predefined time period, respective measurements of a voltage in the respective connection point for said output terminal and of a voltage in the respective connection point for said another output terminal.

11. The electronic determination device according to claim 1, wherein the converter is a N-level converter, each switching half-branch including (N−1) converter switch(es), N being an integer greater than or equal to 2.

12. A power supply chain for an electric machine, the power supply chain comprising:
   a converter including first and second input terminals, at least two output terminals and, for each output terminal, a switching branch with first and second switching half-branches connected in series between the two input terminals and connected to each other at an intermediate point, the first switching half-branch being connected to the first input terminal and the second switching half-branch being connected to the second input terminal, the intermediate point being connected to said output terminal, each switching half-branch including at least one converter switch;
   a connection set connected to the converter and adapted to be connected to the electric machine, the connection set including a filter connected to the output terminals and a cable connected to the filter; the cable including, for each output terminal, a respective electrical conductor; the filter including, for each output terminal, a respective electromagnetic coil connected to said output terminal and a respective capacitor connected to said coil in a connection point, in derivation with respect to said coil and to the respective conductor of the cable; and
   an electronic determination device for determining at least one characteristic parameter of the connection set,
   wherein the electronic determination device is according to claim 1.

13. A method for determining at least one characteristic parameter of a connection set connected between a converter and an electric machine,
   the converter including first and second input terminals, at least two output terminals and, for each output terminal, a switching branch with first and second switching half-branches connected in series between the two input terminals and connected to each other at an intermediate point, the first switching half-branch being connected to the first input terminal and the second switching half-branch being connected to the second input terminal, the intermediate point being connected to said output terminal, each switching half-branch including at least one converter switch;
   the connection set including a filter connected to the output terminals and a cable connected between the filter and the electric machine; the cable including, for each output terminal, a respective electrical conductor; the filter including, for each output terminal, a respective electromagnetic coil connected to said output terminal and a respective capacitor connected to said coil in a connection point, in derivation with respect to said coil and to the respective conductor of the cable;
   the method being implemented by an electronic determination device comprising, for each output terminal, a device switch configured to be connected to the respective capacitor, the method comprising the following steps:
      generate a voltage pulse through the connection set, by controlling the converter switches and each device switch;
      acquire measurements of respective current(s) and voltage(s) through the filter, further to the generation of the respective voltage pulse; and
      calculate at least one characteristic parameter of the connection set according to the respective current(s) and voltage(s) measurements,
   wherein the at least one characteristic parameter comprises:
      a characteristic impedance of a respective conductor of the cable;
      a propagation time associated to a respective conductor of the cable;
      a parasitic capacitance of a respective conductor of the cable;
      an inductance of a respective electromagnetic coil of the filter;
      a resonance frequency of the connection set, or
      a combination thereof.

14. A non-transitory computer-readable medium having a computer program including software instructions stored thereon which, when executed by a processor, implement the method according to claim 13.

* * * * *